United States Patent [19]
Park et al.

[11] Patent Number: 6,153,489
[45] Date of Patent: Nov. 28, 2000

[54] FABRICATION METHOD OF INDUCTOR DEVICES USING A SUBSTRATE CONVERSION TECHNIQUE

[75] Inventors: Min Park; Hyun Kyu Yu, both of Daejeon, Rep. of Korea

[73] Assignee: Electronics and Telecommunications Research Institute, Daejeon, Rep. of Korea

[21] Appl. No.: 09/162,784

[22] Filed: Sep. 30, 1998

[30] Foreign Application Priority Data

Dec. 22, 1997 [KR] Rep. of Korea ................ 97-71622

[51] Int. Cl.⁷ .................................................. H01L 21/20
[52] U.S. Cl. .......................................... 438/381; 438/409
[58] Field of Search .................................. 438/381, 238, 438/409, 408

[56] References Cited

U.S. PATENT DOCUMENTS

| | | |
|---|---|---|
| 5,336,921 | 8/1994 | Sundaram et al. . |
| 5,497,337 | 3/1996 | Ponnapalli et al. . |
| 5,539,241 | 7/1996 | Abidi et al. . |
| 5,736,749 | 4/1998 | Xie ................................................ 257/3 |

OTHER PUBLICATIONS

Bon–Kee Kim et al., Monolithic Planar RF Inductor and Waveguide Structures on Silicon with Performance Comparable to those in GaAs MMIC, 1995 IEEE, pp. IEDM95 717–720.

Seung Won Paek et al., "Air–Gap Stacked Spiral Inductor", IEEE Microwave and Guided Wave Letters, vol. 7, No. 10, Oct. 1997, pp. 329–331.

J. Y. C. Change et al., "Large Suspended Inductors on Silicon and Their Use in a 2–$\mu$m CMOS RF Amplifier", 1993 IEEE, pp. 246–248.

J. N. Burghartz et al., "Monolithic Spiral Inductors Fabricated Using a VLSI Cu–Damascene Interconnect Technology and Low–Loss Substrates", 1996 IEEE, pp. IEDM96–99—IEDM96–102.

*Primary Examiner*—Tuan H. Nguyen
*Attorney, Agent, or Firm*—Jacobson, Price, Holman & Stern, PLLC

[57] ABSTRACT

A fabrication method of high performance integrated inductor devices using a substrate conversion technique is disclosed. By employing the trench-shaped porous silicon with high insulating property, the lossy characteristic of the silicon substrate is essentially to minimize. Also, by employing the conductive doped layer interposed between the porous silicon layer and the silicon substrate, the parasitic capacitance between metal lines and the silicon substrate is remarkably decreased. The present invention allows fabrication of high performance integrated inductors having high quality factor. Also, this invention prevents mutual-coupling between the silicon substrate and metal lines. As a result, integrated inductor devices according to this invention is readily adaptable for use in radio frequency integrated circuit (RF IC).

11 Claims, 9 Drawing Sheets

FABRICATION METHOD OF INDUCTOR DEVICES USING A SUBSTRATE CONVERSION TECHNIQUE

BACKGROUND OF THE INVENTION

1. Field of the Invention

The present invention relates generally to a method for manufacturing inductor devices, and more particularly to a fabrication method of high performance integrated inductor devices using a substrate conversion technique.

2. Description of the Related Art

Recently emerging need for radio frequency (RF) integrated circuits (IC) for such markets as cellular telephones, wireless modems, and other types of communication equipment, has pushed silicon technology to several gigahertz applications. Therefore, attempts to integrate active elements and passive elements such as inductor into one chip have prompted interest in monolithic RF IC. In the RF IC, the inductor is used for an impedance matching.

The major factor for high performance integrated inductor is an quality factor (Q). The objective of high-Q inductor designs is to increase inductance and decrease resistance, while keeping parasitic capacitance to a minimum so that high oscillation frequencies can be achieved. However, lossy characteristic of Si substrate has prohibited the fabrication of high Q inductor and low loss transmission lines on the Si technology.

FIG. 1 illustrates a conventional spiral inductor structure in (A) cross-sectional view and (B) plan view. Referring to FIGS. 1(A) and 1(B), a first interlayer dielectric 2 with active elements such as CMOS (not shown) is formed on a silicon substrate 1. Then a first metal level 3, a second interlayer dielectric 4, a second metal level 6 and a passivation layer 7 are sequentially formed on the first interlayer dielectric 2. The first metal level 3 is covered by the second dielectric 4 through which a via hole 5 is formed. The first metal wire 3 is used as a cross-under to make connection to the second metal wire 6 via a contact hole 5. The spiral coil is built at the second metal level 6.

In this spiral inductor structure, the parasitic capacitance becomes heavily dependant to the thickness of the second insulator 4 used as a dielectric material. That is, the decreasement of the parasitic capacitance is very difficult because of the limitation of the dielectric thickness. As a result, the conventional art has the difficulty in producing a high performance inductor in silicon that is suitable for RF applications.

So, till now, GaAs substrate is mainly used for monolithic RF in virtue of its semi-insulating characteristic and high mobility. Modern Si IC process offers good active elements, but it does not provide passive elements like inductor with acceptable performance. This is due to the semiconducting nature of the silicon substrate. There have been several efforts to fabricate the inductor on the Si substrate, but the obtained performance such as Q factor, resonant frequency are not good enough.

SUMMARY OF THE INVENTION

It is therefore an object of the present invention to provide an improved method for manufacturing high performance integrated inductor devices which is capable of decreasing a parasitic capacitance of devices, obviating, for practical purposes, the above-mentioned limitations.

It is another object of the present invention to provide a method for fabricating high performance integrated inductor devices which can minimize a mutual-coupling between silicon substrate and metal levels and is readily adaptable for use in RF IC.

According to a preferred embodiment of this invention, there is provided a method for manufacturing integrated inductor devices on a silicon substrate, comprising the steps of: forming a trench within the silicon substrate; filling the trench with a porous silicon by an electroplating process using a HF containing solvent as a pyrolysis solution to form a trench-shaped porous silicon layer; forming a first interlayer dielectric film on the resultant structure; depositing a lower metal line on a portion of the first interlayer dielectric film, and forming a second interlayer dielectric film on the resultant structure; and forming an upper spiral metal pattern being a central portion of the spiral metal pattern to make connection of the lower metal line through a via hole.

Preferably, the spiral pattern of the upper metal line is arranged within the porous silicon layer.

According to another embodiment of this invention, there is provided a method for manufacturing an integrated inductor devices on a silicon substrate, comprising the steps of: forming a trench within the silicon substrate; forming a conductive doped layer by implanting high-concentration dopants of the opposite conductivity type to that of the silicon substrate into a bottom of the trench; filling the trench with a porous silicon by an electroplating process using a HF containing solvent as a pyrolysis solution to form a trench-shaped porous silicon layer; forming a trench electrode filled with a polysilicon at adjacent portion of the silicon substrate to connect said porous silicon layer; forming a first interlayer dielectric film on the resultant structure; depositing a lower metal line on a portion of the first interlayer dielectric film, and forming a second interlayer dielectric film on the resultant structure; and forming an upper spiral metal pattern being a central portion of the spiral metal pattern to make connection of the lower metal line through a via hole.

Preferably, the trench electrode is formed in the region of the silicon substrate so that it is not overlapped with the upper and lower metal lines.

Also, the conductive doped layer can be formed by depositing a highly-doped polysilicon instead of the step of ion-implanting.

Preferably, the silicon substrate is applied with a negative voltage and the trench electrode is applied with a positive voltage, so as to increase a depth of depletion layer.

Other objects, advantages, and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings are only for the purpose of illustrating a preferred embodiment of the invention and are not to be construed as limiting the invention.

DESCRIPTION OF THE PREFERRED EMBODIMENTS

Figure 1A:
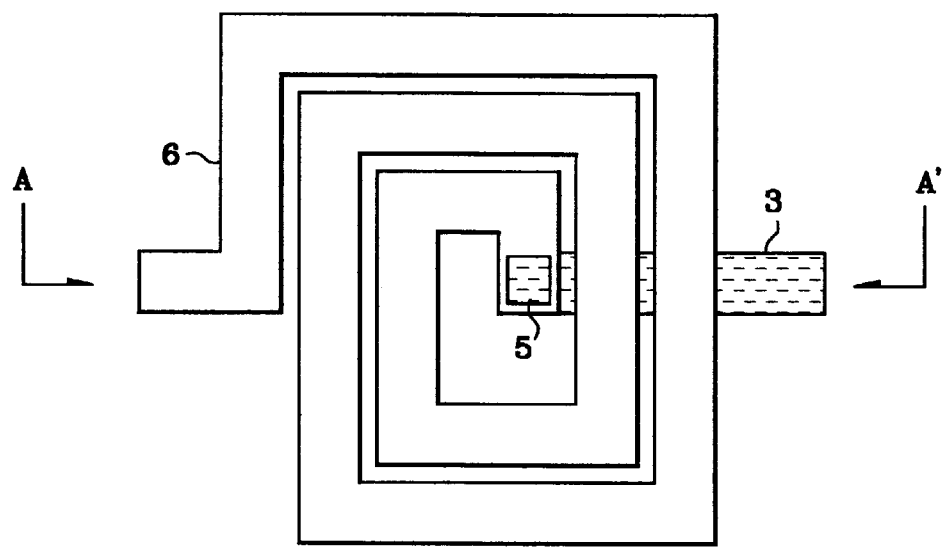
FIG. 1(A) is a plan view of a spiral inductor structure according to the conventional art.
Figure 1B:
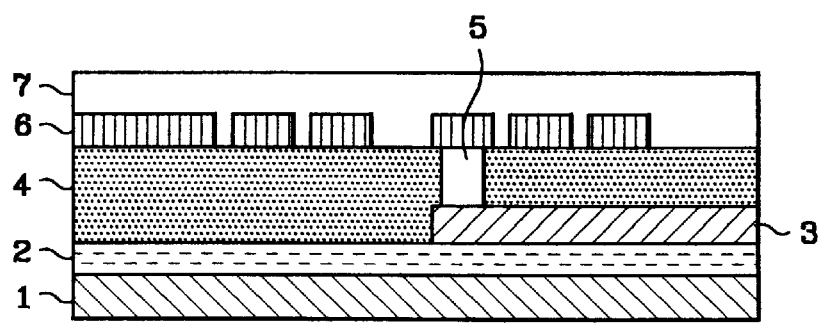
FIG. 1(B) is a cross-sectional view taken along a line A–A' of FIG. 1(A)
Figure 2A:
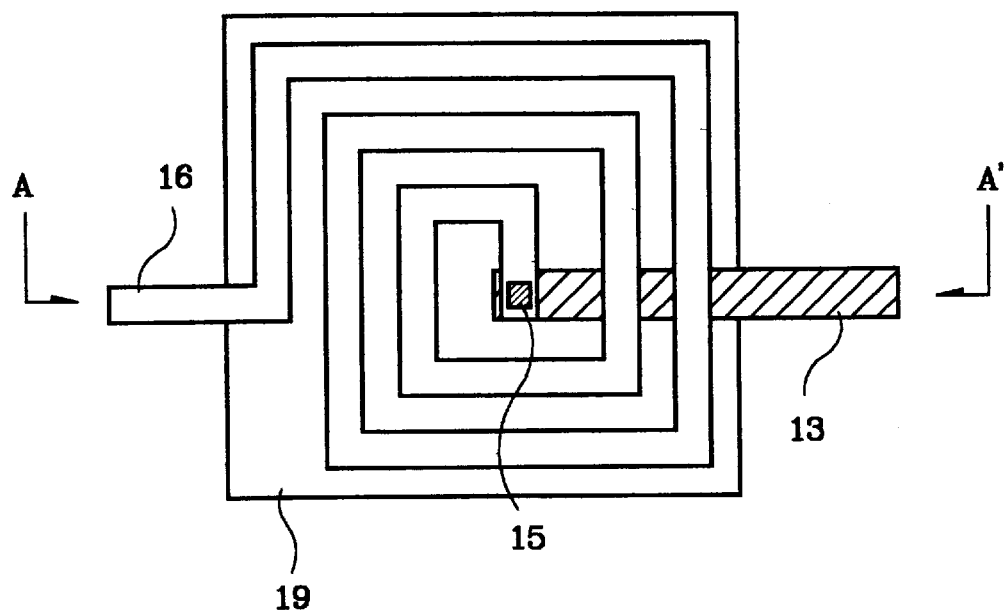
FIG. 2(A) is a plan view of a spiral inductor according to the first embodiment of this invention.
Figure 2B:
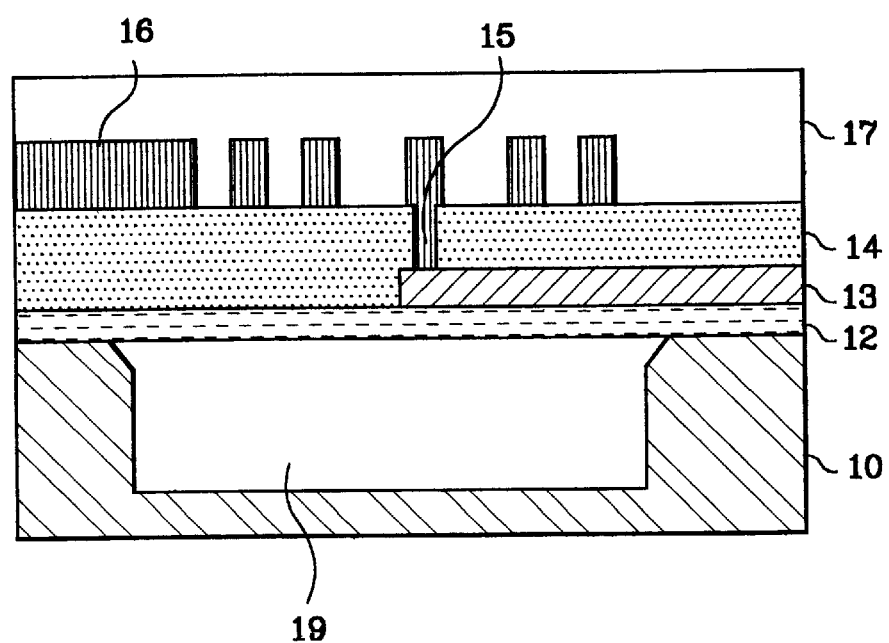
FIG. 2(B) is a cross-sectional view taken along a line A–A' of FIG. 2(A)

Referring now to FIGS. 2(A) and 2(B) which is shown a plan view and a cross-sectional view of the spiral inductor structure, respectively, the first embodiment of this invention will be described in detail.

As shown in FIGS. 2(A) and 2(B), this structure has two levels of metal. A first metal level 13 being above a first dielectric material 12 on a silicon substrate 10 is covered by a second dielectric layer 14. The first metal level is used as a cross-under to make connection to a central portion of a spiral metal pattern 16 through a via hole 15. The via hole 15 is filled with a metal to interconnect the first level with a second metal level 16.

The second metal level 16 is spiral metal patterns, and this spiral metal pattern of the second metal 16 is formed within a trench 19 filled with a porous silicon and formed in the silicon substrate 10, as shown in FIG. 2(A).

This approach solves the limitation problem of high-Q inductor design for RF applications by employing the porous silicon 19 filled in the trench using a substrate conversion technique.

Referring to FIGS. 3(A) to 3(E), the manufacturing method of the spiral inductor according to the first embodiment of this invention will be described.

Figure 3A:
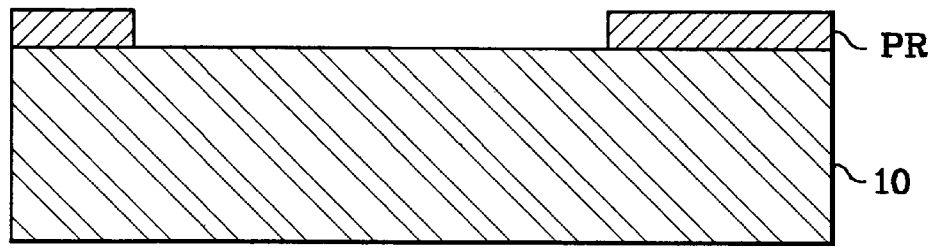
FIGS. 3(A) to 3(E) are schematic cross-sectional process flow diagrams illustrating the major steps to fabricate a spiral inductor in accordance with the first embodiment of this invention.
Figure 3B:
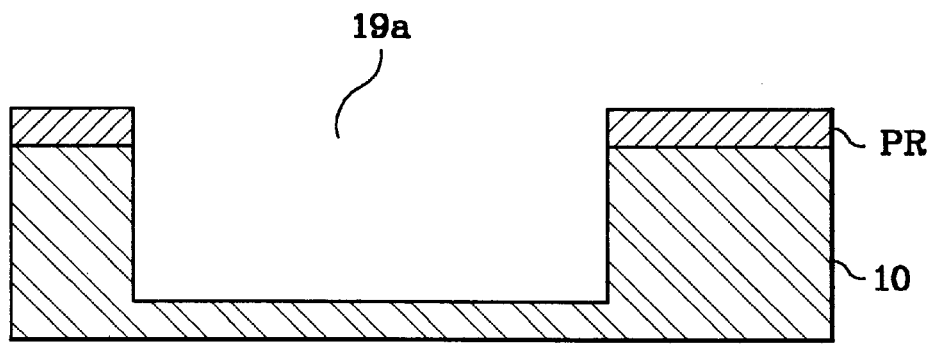

As shown in FIG. 3(A), a predetermined photoresist pattern PR is formed on a p-type (or n-type) silicon substrate 10 by photolithographic process. Then, a trench 19a is formed in the silicon substrate 10 by etching process using the photoresist pattern PR as an etching mask, as shown in FIG. 3(B). The width and depth of the trench 19a can be suitably determined by consideration the thickness of a porous silicon layer to be formed at succeeding processes.

Figure 3C:
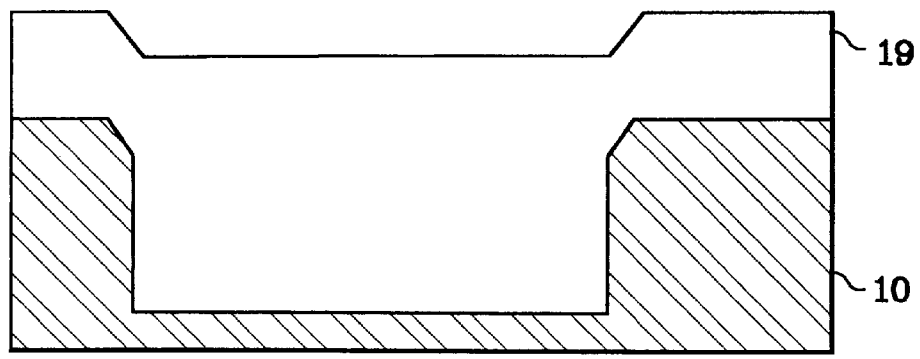

Referring now to FIG. 3(C), the trench 19a is filled with a porous silicon using an electroplating process, after the photoresist pattern PR is removed. More specifically, the silicon substrate 10 having the trench 19a is dipped into an electrolyte solution containing HF, for example $HF:C_2H_5OH=1:1$, and then an anodic process is performed.

As a result, a porous silicon layer 19 having a good insulating property is formed on the entire surface of the exposed silicon substrate 10 such that the trench 19a is completely filled with the porous silicon. This porous silicon layer 19 is to minimize the lossy of the silicon substrate 10. Also, the electroplating for forming the porous silicon layer 19 is easy and simple process, and its growing speed is high, such as 0.3~1.0 micrometers per minute.

Subsequently, the porous silicon layer 19 except for the trench region is removed using a chemical mechanical polishing (CMP), so as to expose the surface of the silicon substrate 10. The exposed surface of silicon substrate is used for forming an active element such as complementary metal oxide semiconductor (CMOS) which constitutes RF IC. In this embodiment, the formation of the active element is omitted.

Figure 3D:
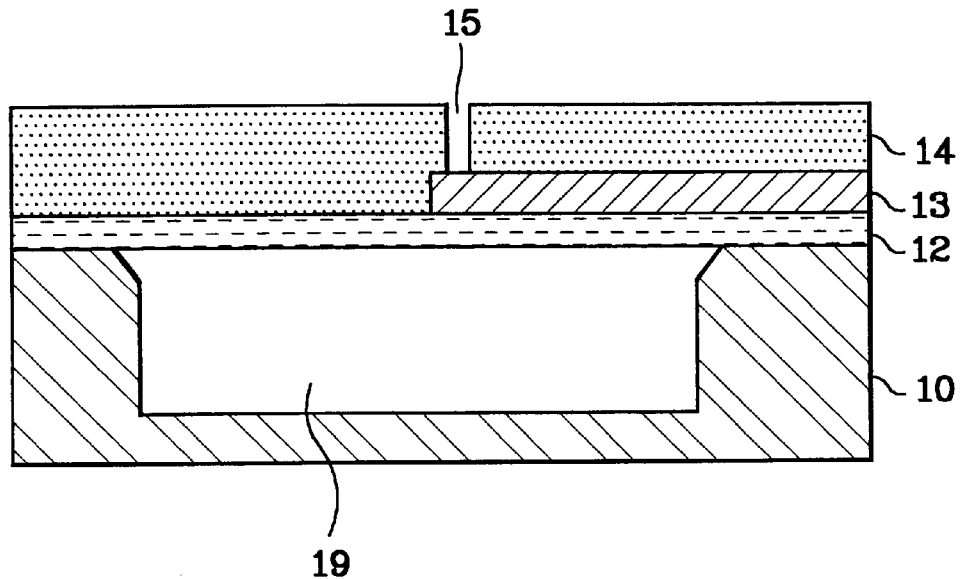

Referring to FIG. 3(D), a first interlayer dielectric film 12 made of TEOS/BPSG is deposited on the entire surface of the resultant structure. Next, a first metal line 13 is formed on the portion of the first interlayer dielectric film 12. Then, a second interlayer dielectric film 14 is formed on the first metal line 13 and the first interlayer dielectric film 12, and a via hole 15 is formed by etching the portion of the second interlayer dielectric film 14.

Figure 3E:
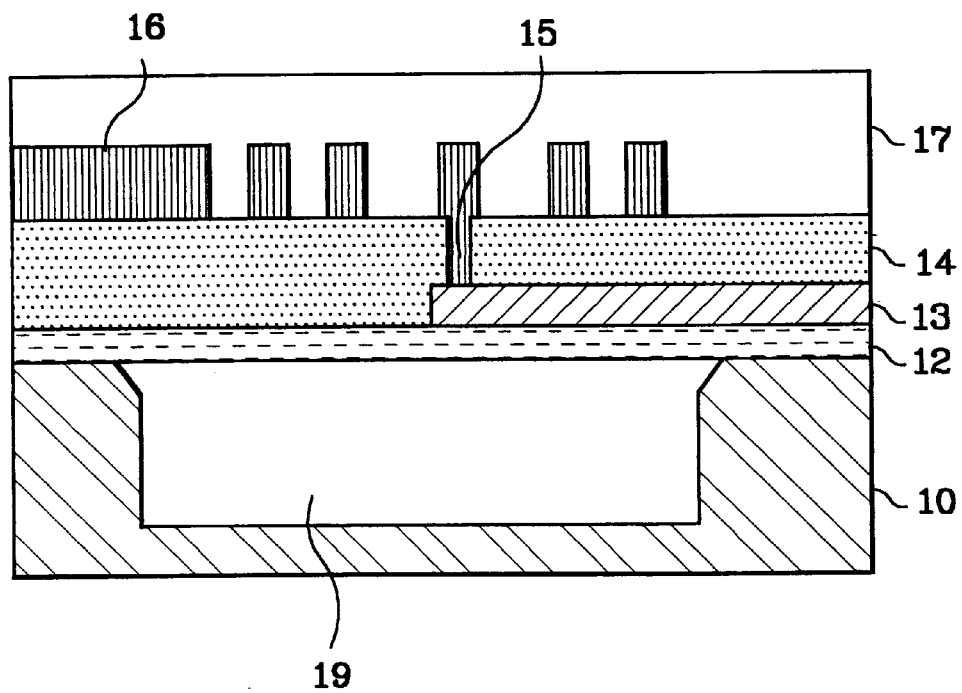

Referring to FIG. 3(E), a second metal line 16 and a passivation film 17 are sequentially formed. The first metal line 13 is used as a cross-under to make connection to a central portion of the spiral metal pattern 16 through the via hole 15. The via hole 15 is filled with a metal to interconnect the first level with a second metal line 16. The second metal line 16 is spiral metal patterns, and this spiral metal pattern of the second metal 16 is formed within the porous silicon layer 19.

According to the embodiment of this invention, by using the porous silicon substrate with good insulating property through the simple substrate conversion technique, the lossy characteristic of silicon substrate is substantially improved, thereby the parasitic capacitance is decreased.

Hereinafter, another embodiment of the present invention is described in detail with reference to FIGS. 4(A) to 4(H) illustrating processing steps for making a spiral inductor.

Figure 4:
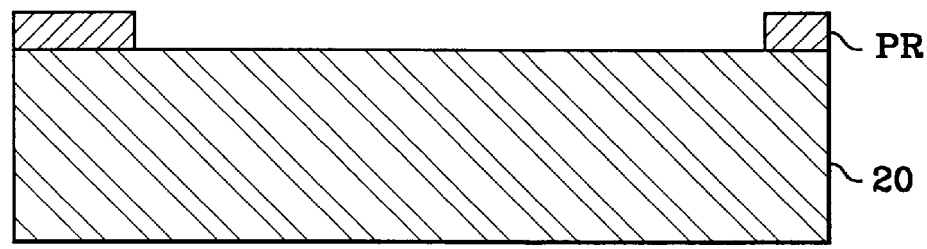
FIGS. 4(A) to 4(H) are schematic representations of processing steps for making a spiral inductor according to the second embodiment of this invention.
Figure 4:
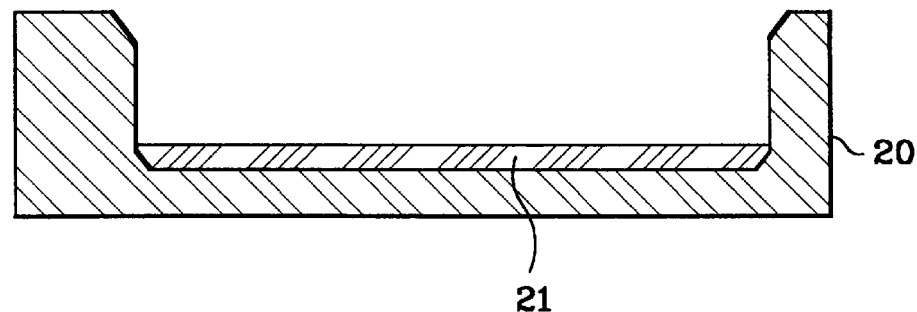
Figure 4:
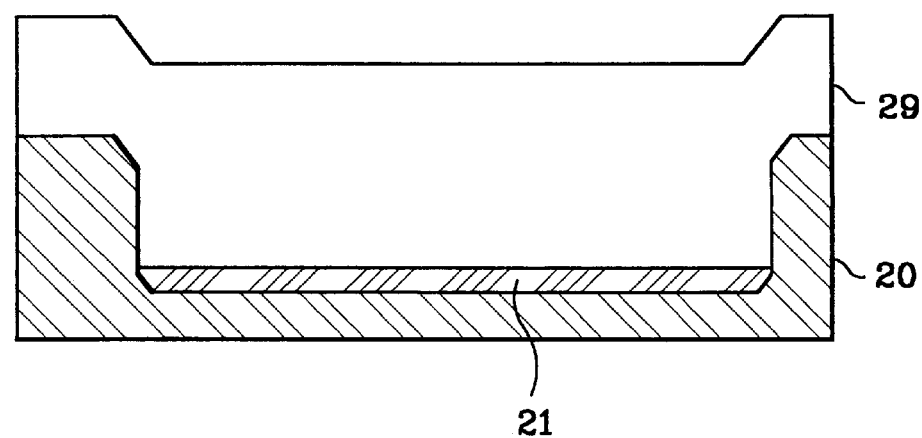
Figure 4:
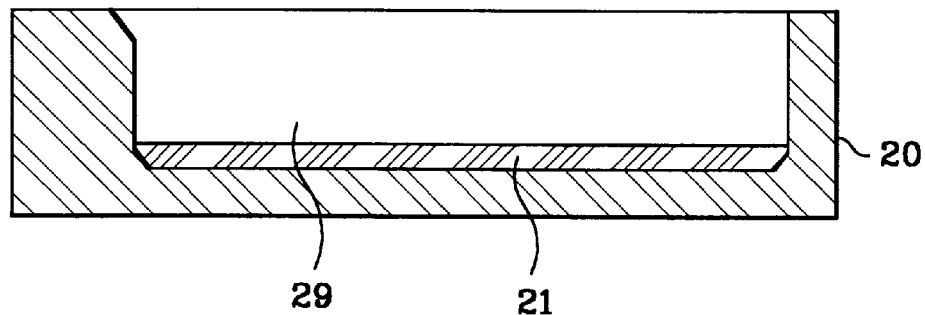
Figure 4:
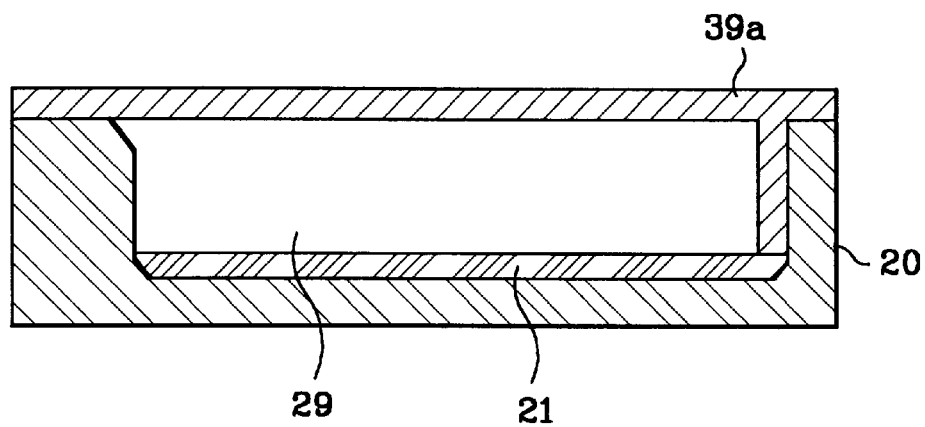
Figure 4:
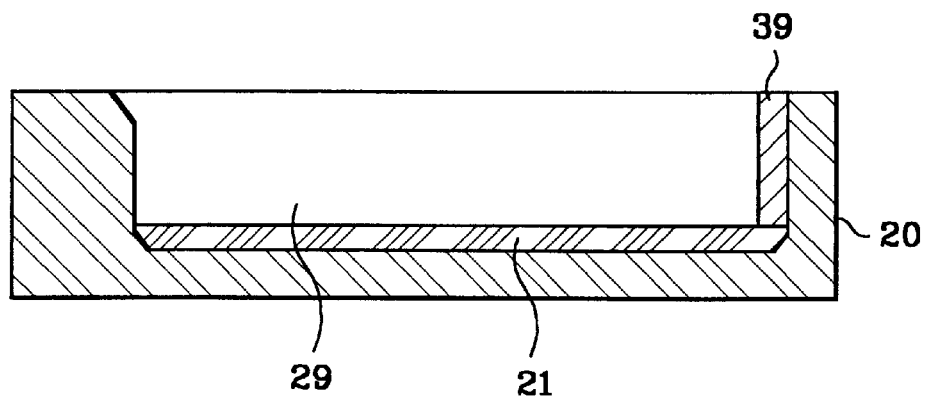

Referring to FIG. 4(A), a predetermined photoresist pattern PR is formed on a p-type (or n-type) silicon substrate 10 by photolithographic process. Then, a trench is formed in the silicon substrate 10 by etching process using the photoresist pattern PR as an etching mask.

Referring to FIG. 4(B), a conductive doped layer 21 is formed on the bottom of the trench by implanting dopants of the opposite conductive type to that of the silicon substrate 20 into the substrate 20, and then the photoresist pattern PR is removed. For example, in case that the p-type silicon substrate 20 is used, an $n^+$ doped layer 21 is formed by implanting n-type dopants of high concentration.

Alternatively, the conductive doped layer 21 can be formed in situ by deposition method using a highly doped polysilicon as a deposition material, instead of the ion-implanting.

Referring now to FIG. 4(C), by using an substrate conversion technique, such as an electroplating, a porous silicon layer 29 having a good insulating property is formed on the entire surface of the resultant structure such that the trench is completely filled with the porous silicon. In this case, an electrolyte solution of $HF:C_2H_5OH=1:1$ is used.

Also, the electroplating for forming the porous silicon layer 29 is easy and simple process, and its growing speed is high, such as 0.3~1.0 micrometers per minute. This porous silicon layer 29 is to minimize the lossy of the silicon substrate 20.

Referring to FIG. 4(D), the porous silicon layer 19 except for the trench region is removed using a chemical mechanical polishing (CMP), so as to expose the surface of the silicon substrate 20. The exposed surface of silicon substrate is used for forming an active element such as complementary metal oxide semiconductor (CMOS) which constitutes RF IC. In is this embodiment, the formation of the active element is omitted.

Referring to FIG. 4(E), for electrical connecting with the conductive doped layer 21, a via hole (not shown) is formed by etching the portion of the porous silicon 29 adjacent of the substrate 20 so as to expose the portion of the conductive doped layer 21, and then a polysilicon film is deposited on the resultant structure such that the via hole is completely filled with the polysilicon.

Next, the polysilicon film except for the via hole is removed, and then a trench electrode 39 connected to the conductive doped layer 21 is formed, as shown in FIG. 4(F). At this time, the trench electrode 39 is preferably designed which is not overlapped with metal lines of inductor devices.

Figure 4G:
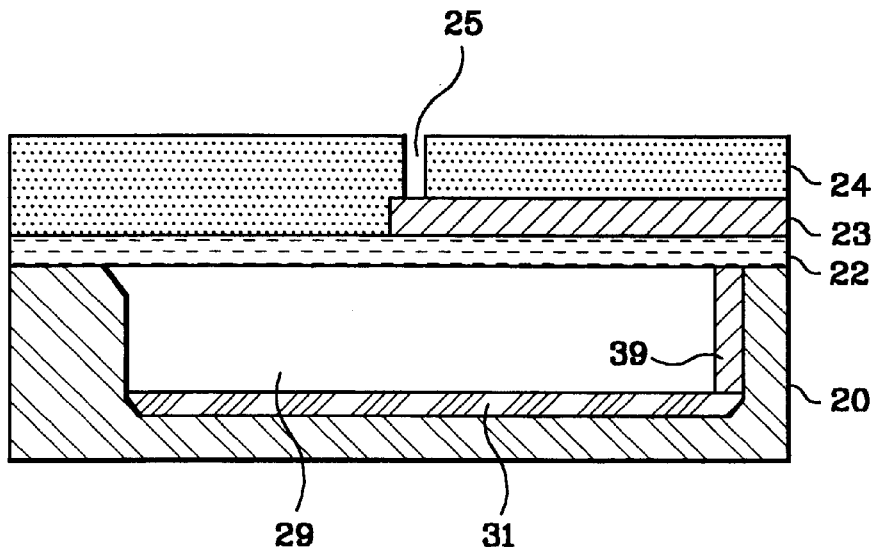

Referring to FIG. 4(G), a first interlayer dielectric film 22 made of TEOS/BPSG is deposited on the entire surface of the resultant structure. Next, a first metal line 23 is formed on the portion of the first interlayer dielectric film 22. Then, a second interlayer dielectric film 24 is formed on the first metal line 23 and the first interlayer dielectric film 22, and a via hole 25 is formed by etching the portion of the second interlayer dielectric film 24.

Figure 4H:
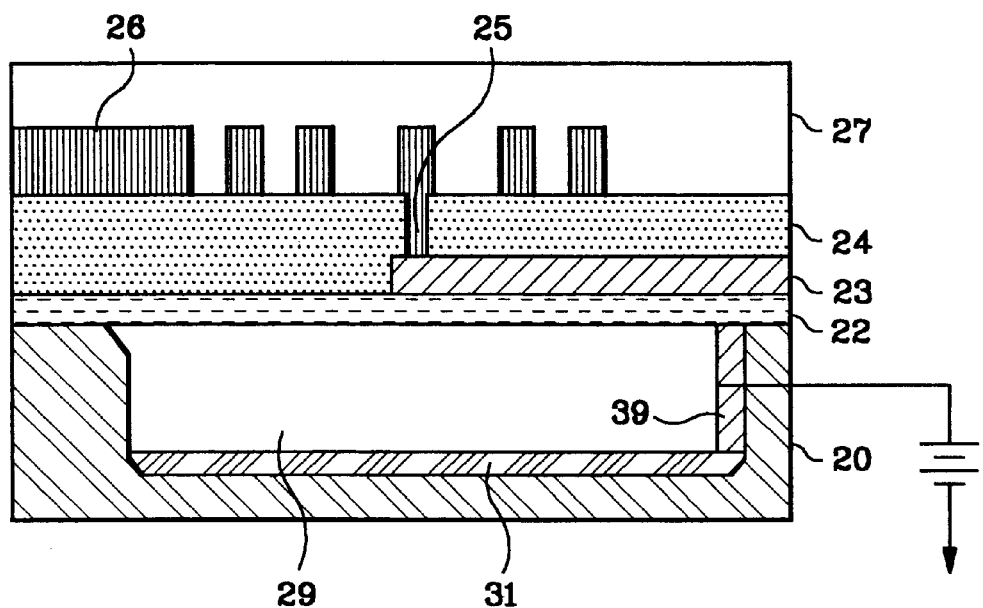

Referring to FIG. 4(H), a second metal line 26 and a passivation film 27 are sequentially formed.

Figure 5A:
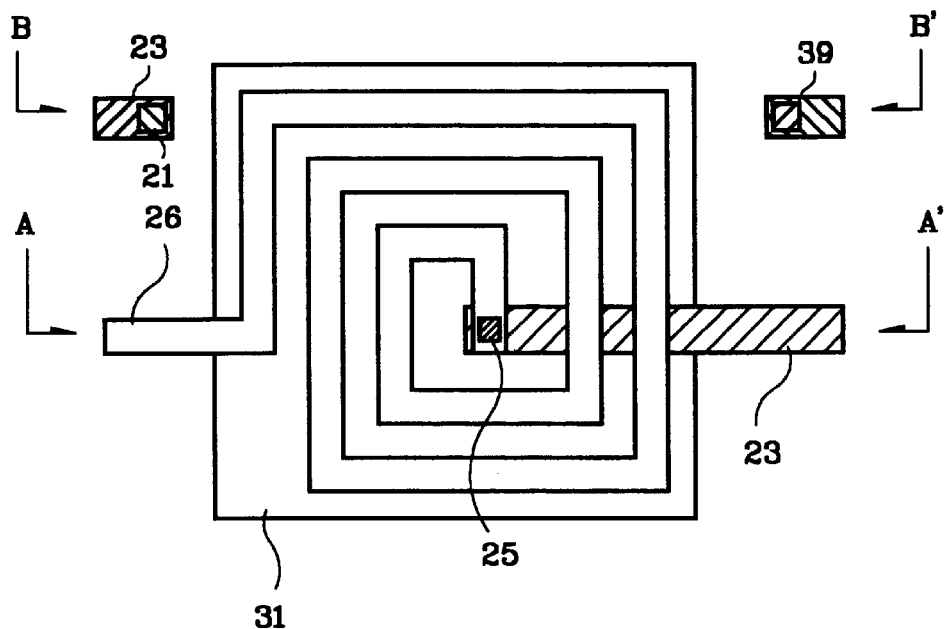
FIG. 5(A) is a plan view of a spiral inductor according to the second embodiment of this invention.
Figure 5B:
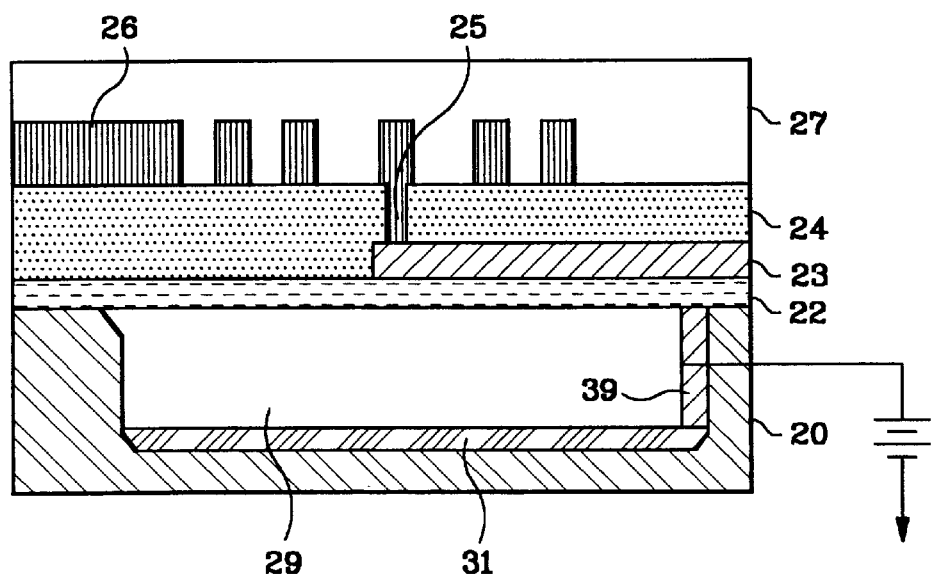
FIG. 5(B) is a cross-sectional view taken along a line A–A' of FIG. 5(A)
Figure 5C:
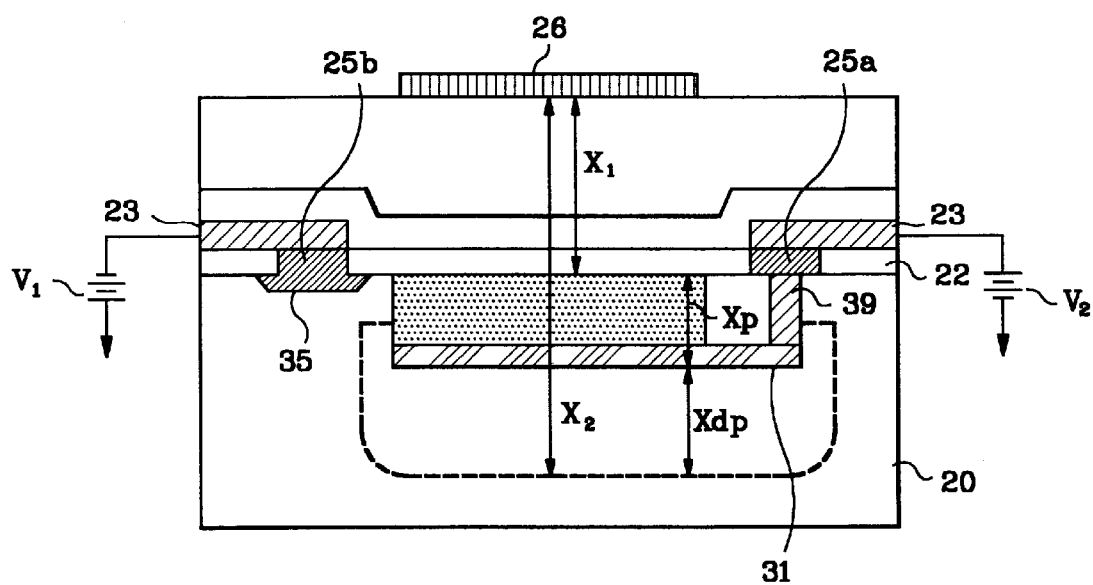
FIG. 5(C) is a cross-sectional view taken along a line B–B' of FIG. 5(A).

FIG. 5(A) is a plan view of a spiral inductor fabricated in accordance with the above-identified embodiment of this invention, FIG. 5(B) is a cross-sectional view taken along a line A–A' of FIG. 5(A), and FIG. 5(C) is a cross-sectional view taken along a line B–B' of FIG. 5(A).

As shown in FIGS. 5(A) and 5(B), the first metal line 23 is used as a cross-under to make connection to a central portion of the spiral metal pattern 26 through the via hole 25. The via hole 25 is filled with a metal to interconnect the first-level with a second metal line 26. The second metal line 26 is spiral metal patterns, and this spiral metal pattern of the second metal 26 is formed within the trench-shaped porous silicon layer 29 or the conductive doped film 31 underlying the porous silicon layer 29, as shown in FIG. 5(A).

As described above, in the second embodiment of this invention, the lossy characteristic of the silicon substrate 20 is decreased by employing the trench-shaped porous silicon 29 with high insulating property, and the parasitic capacitance between metal lines and the silicon substrate is remarkably decreased by further employing the conductive doped layer 31 interposed between the porous silicon layer 29 and the silicon substrate 20.

Referring now to FIG. 5(C), the features of the present invention will be more clear.

Here, a negative voltage from a power supply $V_1$ (or, grounding) is applied to the P-type silicon substrate 20 via the first metal line 23, a contact hole 25b and a P$^+$ diffusion region 35, while a positive voltage from a power supply $V_2$ is applied the N$^+$ conductive layer 31 via the first metal line 23, a contact hole 25a and the trench electrode 39.

That is, when a reverse bias voltage is applied between the P-type silicon substrate 20 and the N$^+$-type conductive doped layer 31, a depletion layer having a depth Xdp is formed in the silicon substrate 20, as shown in FIG. 5(C).

As a result, the parasitic capacitance in the prior art is determined by a distance $X_1$ from the substrate 20 to the second metal line 26. While, the parasitic capacitance in this invention is determined by a distance $X_2$ which corresponds to the sum of the depth $X_1$, the depth Xp of trench and the depth Xdp of the depletion layer. Therefore, the parasitic capacitance is remarkably decreased. In other words, the parasitic capacitance is decreased as the depth Xdp of the depletion layer is increased since the capacitance is in reverse proportion to the depth of the depletion layer.

In this embodiment, the depth Xdp of the depletion layer is defined as following equations:

$$X_{dp} = \frac{[2\varepsilon(\phi_0 - V_R)N_D]^{\frac{1}{2}}}{qN_A(N_A + N_D)}$$

$$\phi_0 = V_T \ln \frac{N_A N_D}{n_i^2}$$

wherein, $\varepsilon$ denotes silicon dielectric constant, $V_T$ deno-es Boltzmann's thermal voltage having value of 26 mV at the room temperature, and $N_A$, $N_D$ and $n_i^2$ are P-type doping concentration, N-type doping concentration, and an intrinsic doping concentration of silicon, respectively.

For example, in case that the concentration of the N+ doped layer 31, $N_D=1\times10^{20}/cm^3$, the concentration of silicon substrate 20, $N_A=7\times10^{12}/cm^3$, and $n_i^2=1.5\times10^{10}/cm^3$, the reverse bias voltage $V_R$ is equal to –3 volts. Accordingly, the depth of depletion layer Xdp is equal to about 26.5 $\mu$m when $V_R=-3V$, and the depth of depletion layer Xdp is equal to about 34.7 $\mu$m when $V_R=-5V$.

Also, the inductor metal lines are positioned between the trench electrodes, so that the additive parasitic capacitance due to the overlap of the inductor metal lines and the trench electrode is not generated.

According to the preferred embodiments of the present invention, the aforementioned process allows fabrication of high performance integrated inductors having high Q. Also, this invention prevents mutual-coupling between the silicon substrate and metal lines. Additionally, the present invention is readily adaptable for use in RF IC.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method for manufacturing an integrated inductor devices on a silicon substrate, comprising the steps of:
   (a) forming a trench within the silicon substrate;
   (b) filling the trench with a porous silicon by an electroplating process using a HF containing solvent as a pyrolysis solution to form a trench-shaped porous silicon layer;
   (c) forming a first interlayer dielectric film on the resultant structure;
   (d) depositing a lower metal line on a portion of the first interlayer dielectric film, and forming a second interlayer dielectric film on the resultant structure; and
   (f) forming an upper spiral metal pattern being a central portion of the spiral metal pattern to make connection of the lower metal line through a via hole.

2. The method according to claim 1, after the step of (b) filling the trench with a porous silicon, further comprising the step of flattening the substrate having the trench filled with porous silicon using a chemical mechanical polishing.

3. The method according to claim 1, wherein the pyrolysis solution of electroplating uses HF:CH$_2$H$_5$OH=1:1.

4. The method according to claim 1, wherein the spiral pattern of the upper metal line is arranged within the porous silicon layer.

5. A method for manufacturing an integrated inductor devices on a silicon substrate, comprising the steps of:
   (a) forming a trench within the silicon substrate;

(b) forming a conductive doped layer by implanting high-concentration dopants of the opposite conductivity type to that of the silicon substrate into a bottom of the trench;

(c) filling the trench with a porous silicon by an electroplating process using a HF containing solvent as a pyrolysis solution to form a trench-shaped porous silicon layer;

(d) forming a trench electrode filled with a polysilicon at adjacent portion of the silicon substrate to connect said porous silicon layer;

(e) forming a first interlayer dielectric film on the resultant structure;

(f) depositing a lower metal line on a portion of the first interlayer dielectric film, and forming a second interlayer dielectric film on the resultant structure; and (g) forming an upper spiral metal pattern being a central portion of the spiral metal pattern to make connection of the lower metal line through a via hole.

6. The method according to claim 5, wherein said trench electrode is formed in the region of the silicon substrate so that it is not overlapped with the upper and lower metal lines.

7. The method according to claim 5, instead of the step of ion-implanting in order to form said conductive doped layer, the step of depositing a highly-doped polysilicon is used for forming the conductive doped layer.

8. The method according to claim 5, wherein the pyrolysis solution of electroplating uses $HF:CH_2H_5HO=1:1$.

9. The method according to claim 5, further comprising the steps of applying a negative voltage to the silicon substrate and applying a positive voltage to the trench electrode, so as to increase a depth of depletion layer.

10. The method according to claim 5, after the step of (c) filling the trench with a porous silicon, further comprising the step of flattening the substrate having the trench filled with porous silicon using a chemical mechanical polishing.

11. The method according to claim 5, wherein said silicon substrate is P-type and said trench electrode is $N^+$-type.

* * * * *